(12) United States Patent
Park et al.

(10) Patent No.: US 12,716,943 B2
(45) Date of Patent: Aug. 25, 2026

(54) INTEGRATED CIRCUIT, MEMORY DEVICE INCLUDING THE INTEGRATED CIRCUIT, AND METHOD OF OPERATING THE SAME

(71) Applicant: Samsung Electronics Co., Ltd., Suwon-si (KR)

(72) Inventors: Seaeun Park, Suwon-si (KR); Saeeun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/604,021

(22) Filed: Mar. 13, 2024

(65) Prior Publication Data

US 2024/0310437 A1 Sep. 19, 2024

(30) Foreign Application Priority Data

Mar. 17, 2023 (KR) ........................ 10-2023-0035240
Jul. 7, 2023 (KR) ........................ 10-2023-0088621

(51) Int. Cl.
*G01R 31/3177* (2006.01)
*G11C 16/04* (2006.01)

(52) U.S. Cl.
CPC ...... *G01R 31/3177* (2013.01); *G11C 16/0483* (2013.01)

(58) Field of Classification Search
None
See application file for complete search history.

(56) References Cited

U.S. PATENT DOCUMENTS 6,587,981 B1 7/2003 Muradali et al.
7,080,299 B2 7/2006 Mclaurin
7,308,631 B2 12/2007 Mclaurin
8,239,818 B1 * 8/2012 Monroe .................. G06F 30/30 716/101
8,302,065 B2 10/2012 Shomrony et al.
8,694,951 B1 4/2014 Prasanna et al.
8,732,632 B1 * 5/2014 Keller ............. G01R 31/31855 716/101

(Continued)

OTHER PUBLICATIONS

A Case Study of Hierarchical Diagnosis for Core-Based SoC, Eric Wang, Yu Huang, Wu-Tung Cheng, Wu Yang and James Fu (Year: 2010).*

(Continued)

*Primary Examiner* — Guerrier Merant
(74) *Attorney, Agent, or Firm* — Wolf, Greenfield & Sacks, P.C.

(57) ABSTRACT

An integrated circuit includes: (i) a first block containing a first wrapper and a first area of circuit elements isolated by the first wrapper, (ii) a core logic circuit containing a target block, which includes a second wrapper and a second area of circuit elements isolated by the second wrapper, and a third wrapper and a third area of circuit elements isolated by the third wrapper, and (iii) a second block containing a fourth wrapper and a fourth area isolated by the fourth wrapper. The second wrapper is connected in series with the first wrapper, and is configured to support performance of a test operation on the second area. The third wrapper is connected in series with the fourth wrapper, and is configured to support performance of a test operation on the third area.

20 Claims, 13 Drawing Sheets

(56) References Cited

U.S. PATENT DOCUMENTS

| | | | | |
|---|---|---|---|---|
| 10,234,504 | B1 | 3/2019 | Mukherjee et al. | |
| 10,955,472 | B1 | 3/2021 | Trock et al. | |
| 11,320,485 | B1 | 5/2022 | Garg et al. | |
| 11,500,019 | B2 | 11/2022 | Klass | |
| 2007/0106923 | A1* | 5/2007 | Aitken | G11C 29/16 714/718 |
| 2009/0259889 | A1* | 10/2009 | Luo | G01R 31/318586 714/E11.17 |
| 2012/0317452 | A1* | 12/2012 | Whetsel | G01R 31/3177 714/E11.159 |
| 2016/0377676 | A1 | 12/2016 | Shor et al. | |
| 2017/0329728 | A1* | 11/2017 | Karri | G06F 21/79 |
| 2020/0300914 | A1 | 9/2020 | Watanabe et al. | |

OTHER PUBLICATIONS

Mamikonyan, Narek , et al., "Multi-Memory Grouping Wrapper with Top Level BIST Algorithm", Open Access Library Journal, vol. 7, No. 5, May 2020, 7 pp.

* cited by examiner

FIG. 3

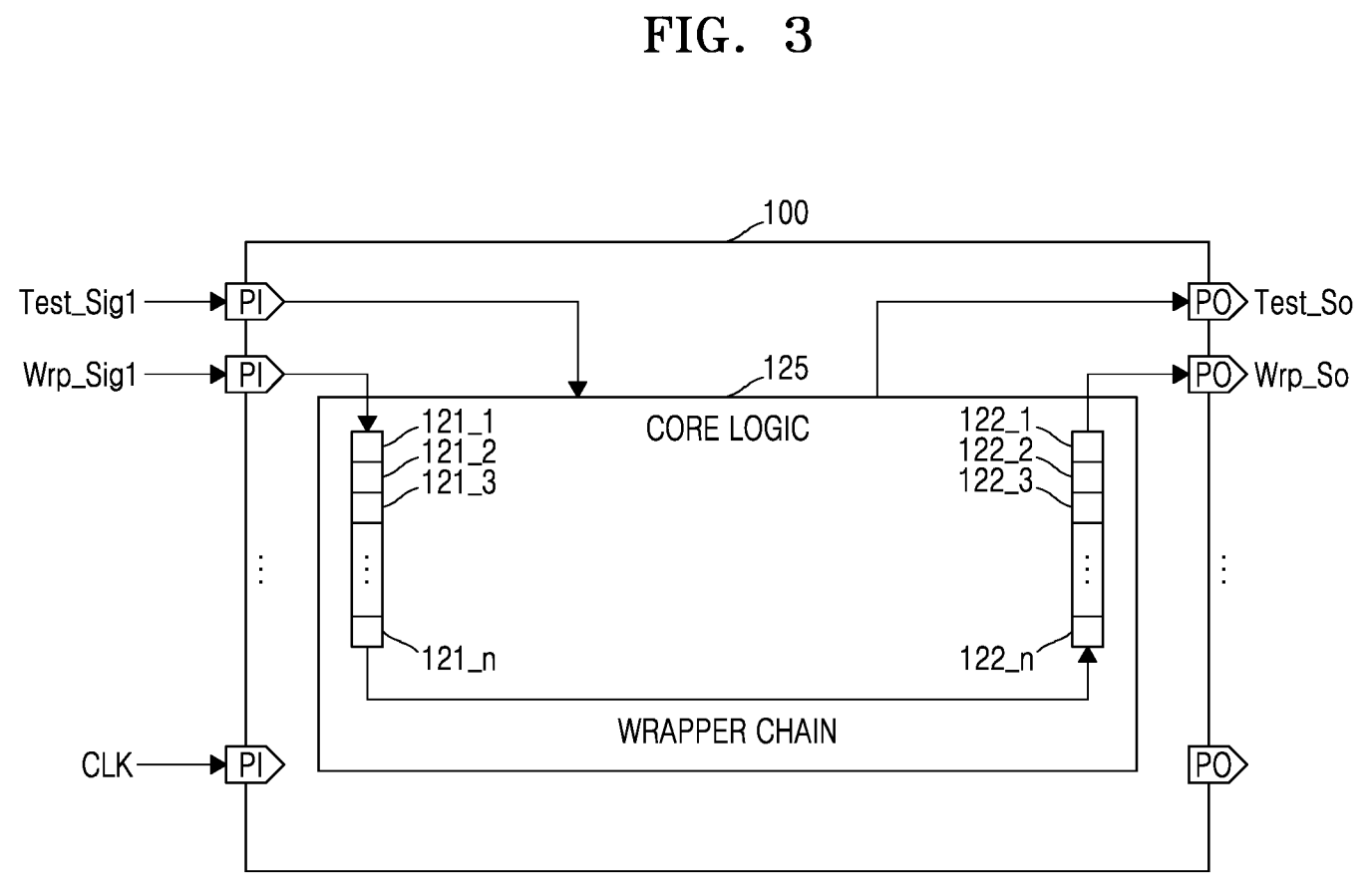

100
125
CORE LOGIC
WRAPPER CHAIN
Test_Sig1
Wrp_Sig1
CLK
PI
PI
PI
PO
PO
PO
Test_So
Wrp_So
121_1
121_2
121_3
121_n
122_1
122_2
122_3
122_n

FIG. 4

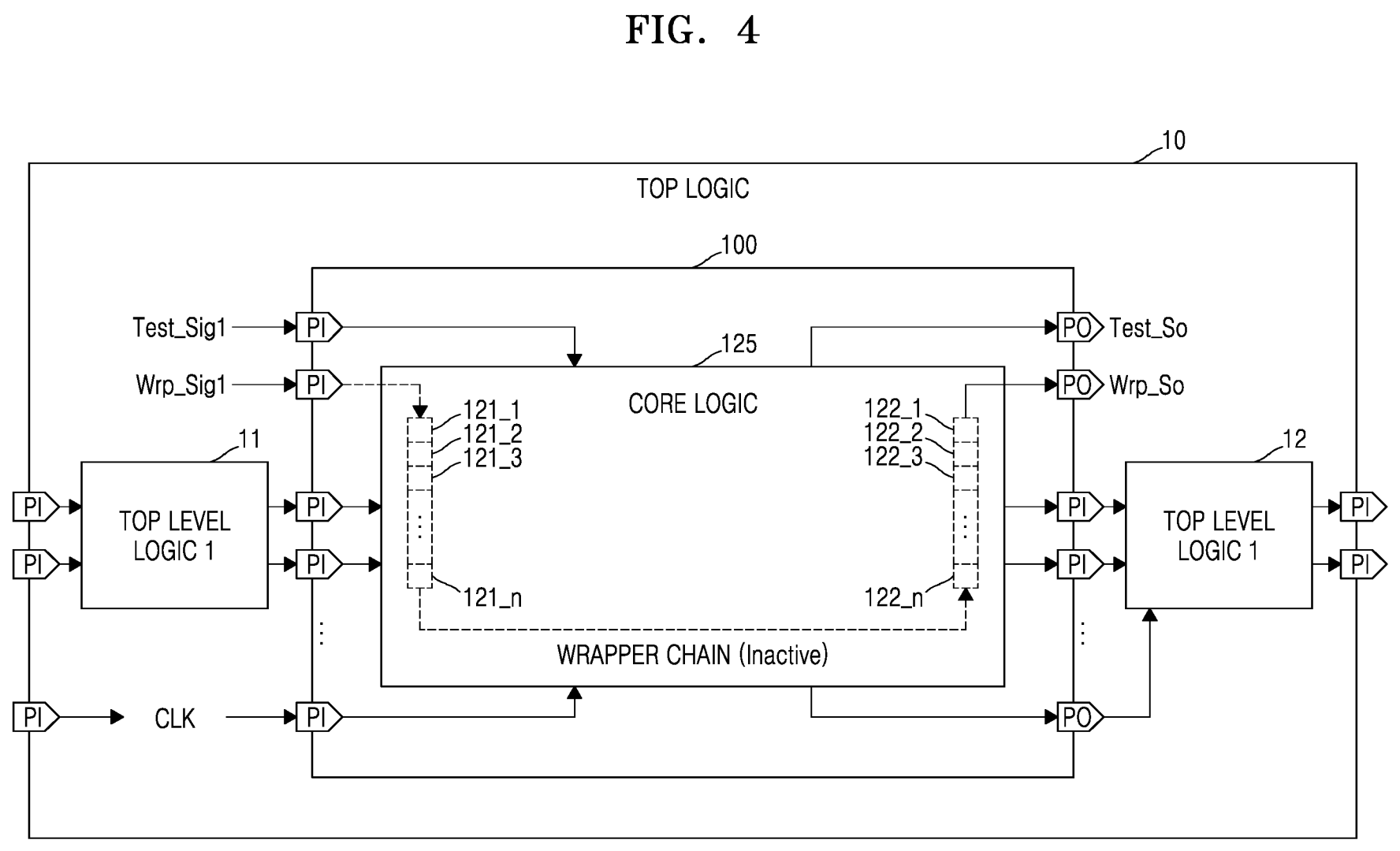

10
TOP LOGIC
100
125
CORE LOGIC
WRAPPER CHAIN (Inactive)
11
TOP LEVEL LOGIC 1
12
TOP LEVEL LOGIC 1
Test_Sig1
Wrp_Sig1
CLK
Test_So
Wrp_So
PI
PO
121_1
121_2
121_3
121_n
122_1
122_2
122_3
122_n

FIG. 5

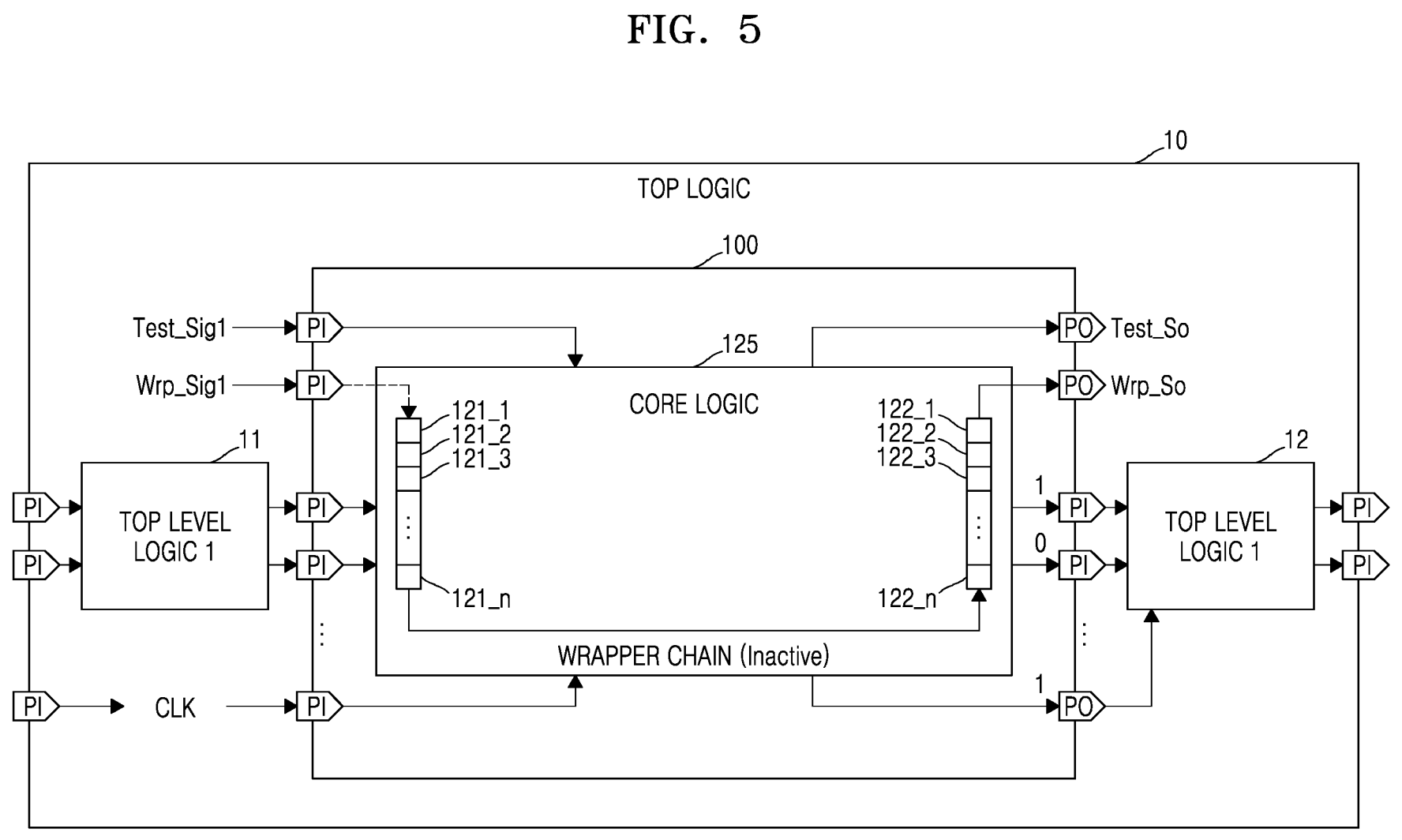

10
TOP LOGIC
100
125
CORE LOGIC
WRAPPER CHAIN (Inactive)
11
TOP LEVEL LOGIC 1
12
TOP LEVEL LOGIC 1
Test_Sig1
Wrp_Sig1
CLK
Test_So
Wrp_So
PI
PO
121_1
121_2
121_3
121_n
122_1
122_2
122_3
122_n
1
0
1

FIG. 6

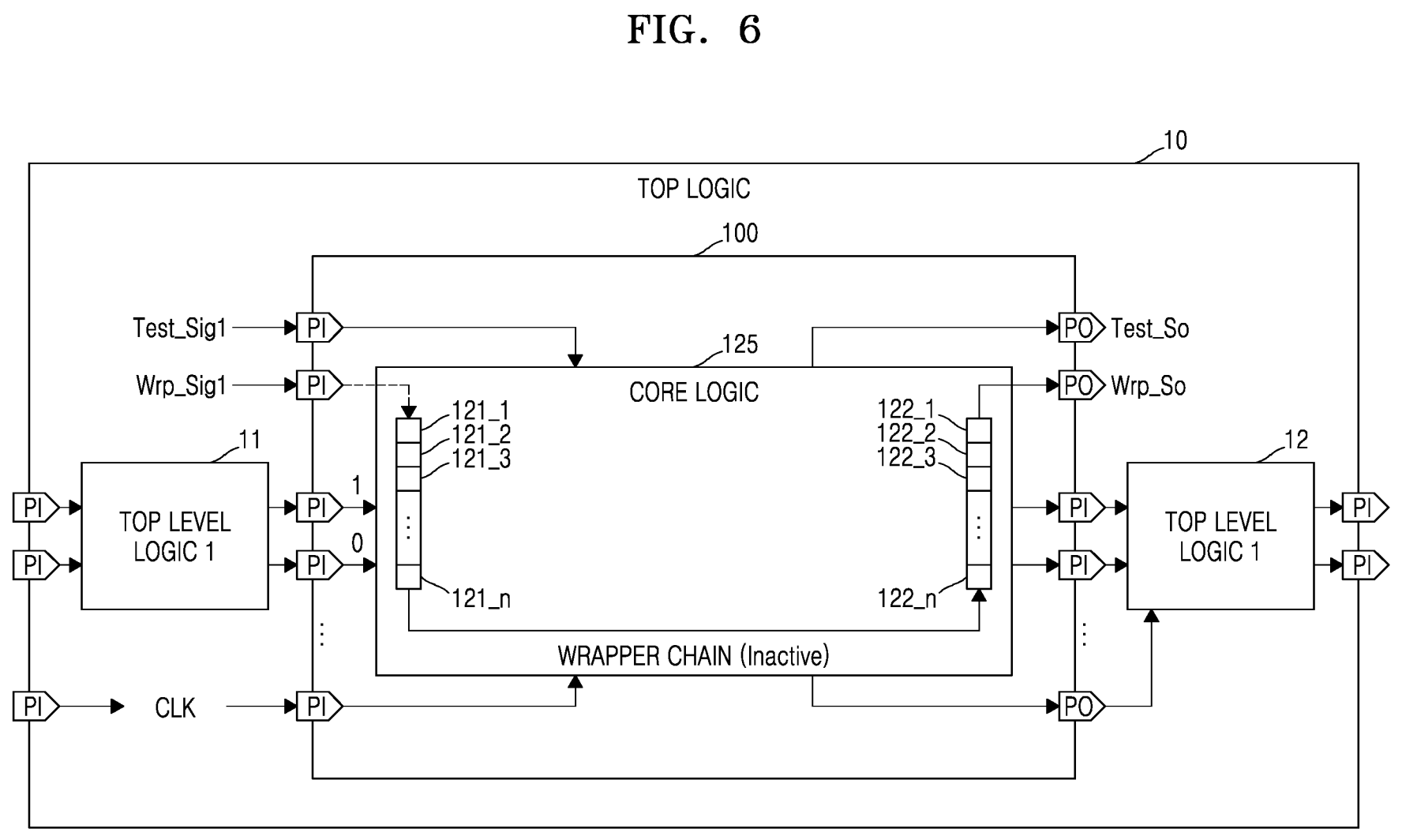

10
TOP LOGIC
100
125
CORE LOGIC
WRAPPER CHAIN (Inactive)
11
TOP LEVEL LOGIC 1
12
TOP LEVEL LOGIC 1
Test_Sig1
Wrp_Sig1
CLK
Test_So
Wrp_So
PI
PO
1
0
121_1
121_2
121_3
121_n
122_1
122_2
122_3
122_n

FIG. 7

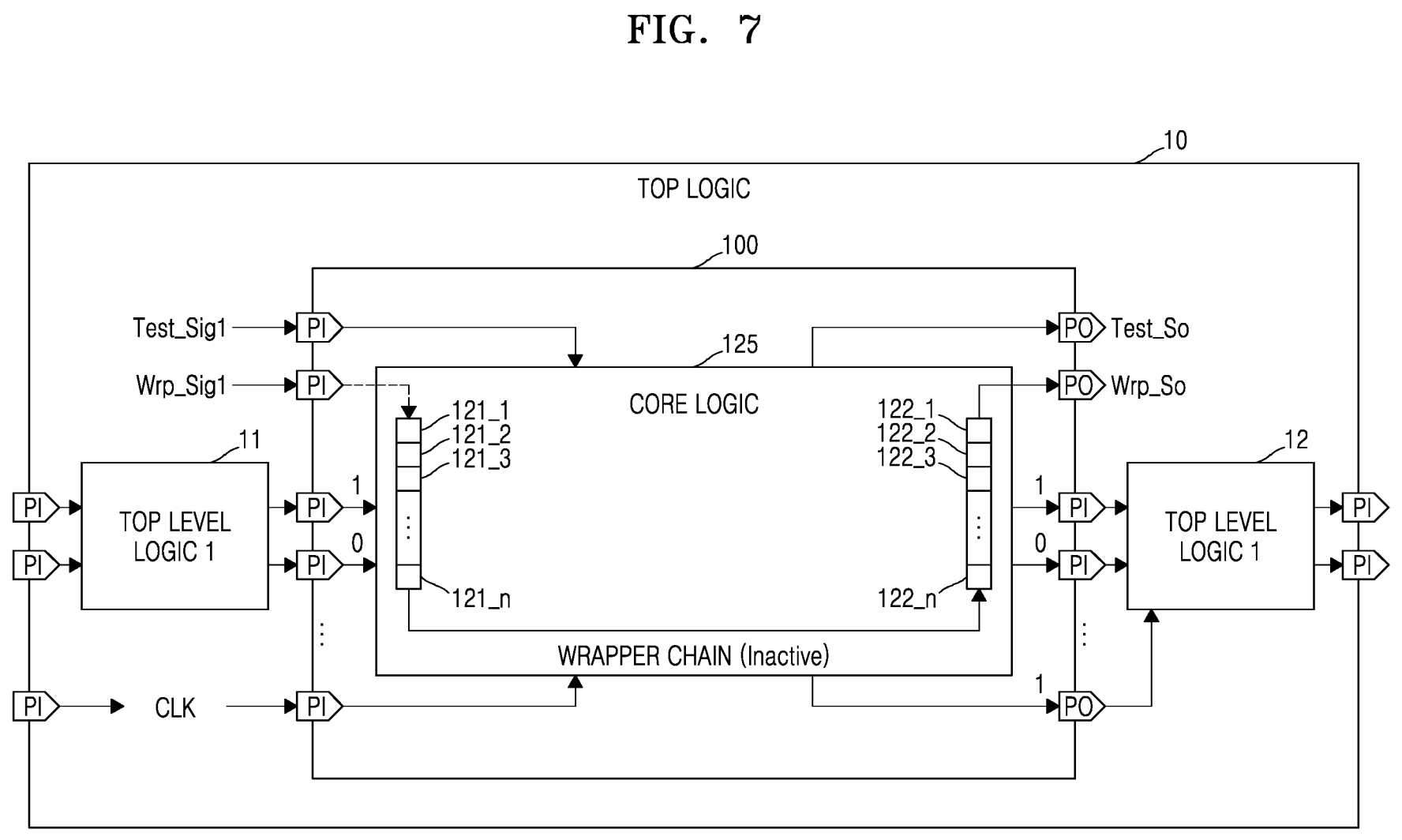

10
TOP LOGIC
100
125
CORE LOGIC
WRAPPER CHAIN (Inactive)
11
TOP LEVEL LOGIC 1
12
TOP LEVEL LOGIC 1
Test_Sig1
Wrp_Sig1
CLK
Test_So
Wrp_So
PI
PO
1
0
121_1
121_2
121_3
121_n
122_1
122_2
122_3
122_n BLKi
BL1
BL2
BL3
NS11
NS12
NS13
NS21
NS22
NS23
NS31
NS32
NS33
SSL1
SSL2
SSL3
GTL1
GTL2
GTL3
GTL4
GTL5
GTL6
GTL7
GTL8
GSL1
GSL2
GSL3
CSL
SST
MC8
MC7
MC6
MC5
MC4
MC3
MC2
MC1
GST
X
Y
Z

FIG. 13

INTEGRATED CIRCUIT, MEMORY DEVICE INCLUDING THE INTEGRATED CIRCUIT, AND METHOD OF OPERATING THE SAME

REFERENCE TO PRIORITY APPLICATIONS

This application claims priority under 35 U.S.C. § 119 to Korean Patent Application Nos. 10-2023-0035240, filed Mar. 17, 2023, and 10-2023-0088621, filed Jul. 7, 2023, the disclosures of which are hereby incorporated herein by reference.

BACKGROUND

The inventive concept relates to an integrated circuit, a memory device including the integrated circuit, and a method of operating the same, and more particularly to, an integrated circuit that secures a test area of a memory device by sharing a plurality of register circuits within a wrapper chain.

As semiconductor integrated circuits achieve higher performance and higher integration, the number of flip-flops included in semiconductor integrated circuits typically increases. Flip-flops are used as data storage devices, and these data storage devices are used to store logic states. A flip-flop is an electronic circuit capable of storing and retaining 1-bit information and is a basic element of a sequential/synchronous logic circuit.

Meanwhile, design for testability (DFT) technologies are widely used to maintain the quality of semiconductor chips and improve test efficiency. Among these, a scan test technology occupies a very important proportion, and has a problem in which an untested area occurs as the size of a semiconductor chip increases.

SUMMARY

The inventive concept provides an integrated circuit capable of sharing register circuits with other adjacent core logic circuits, in a test operation of a core logic circuit.

The inventive concept also provides an integrated circuit that is configured to perform a test operation on areas of a core logic circuit in which a test operation of the related art has not been performed, by sharing register circuits with other adjacent core logic circuits.

According to an aspect of the inventive concept, there is provided an integrated circuit including a $1^{st}$ block including a $1^{st}$ wrapper and a $1^{st}$ area isolated by the $1^{st}$ wrapper, a target block included in a core logic circuit and including a $2^{nd}$ wrapper and a $3^{rd}$ wrapper, and a $2^{nd}$ block including a $4^{th}$ wrapper and a $4^{th}$ area isolated by the $4^{th}$ wrapper. In some embodiments, the target block includes a $2^{nd}$ area isolated by the $2^{nd}$ wrapper and a $3^{rd}$ area isolated by the $3^{rd}$ wrapper, and the $2^{nd}$ wrapper is connected to the $1^{st}$ wrapper and configured to perform a test operation on the $2^{nd}$ area, and the $3^{rd}$ wrapper is connected to the $4^{th}$ wrapper and configured to perform the test operation on the $3^{rd}$ area.

According to another aspect of the inventive concept, there is provided a memory device including an integrated circuit including a $1^{st}$ block including a $1^{st}$ wrapper and a $1^{st}$ area isolated by the $1^{st}$ wrapper, a target block included in a core logic circuit and including a $2^{nd}$ wrapper and a $3^{rd}$ wrapper, and a $2^{nd}$ block including a $4^{th}$ wrapper and a $4^{th}$ area isolated by the $4^{th}$ wrapper. The target block includes a $2^{nd}$ area isolated by the $2^{nd}$ wrapper and a $3^{rd}$ area isolated by the $3^{rd}$ wrapper, and the $2^{nd}$ wrapper is connected to the $1^{st}$ wrapper and configured to perform a test operation on the $2^{nd}$ area, and the $3^{rd}$ wrapper is connected to the $4^{th}$ wrapper and configured to perform the test operation on the $3^{rd}$ area.

According to another aspect of the inventive concept, there is provided a method of operating an integrated circuit performing a test on a memory device including inputting an external test signal to a $1^{st}$ wrapper of a $1^{st}$ block, forming a wrapper chain by using the $1^{st}$ wrapper, a $2^{nd}$ wrapper of a target block, a $3^{rd}$ wrapper of a $2^{nd}$ block, and a $4^{th}$ wrapper of the $2^{nd}$ block, inputting data for testing a core logic circuit through the wrapper chain, capturing the data input to the wrapper chain, and extracting the captured data.

BRIEF DESCRIPTION OF THE DRAWINGS

Embodiments will be more clearly understood from the following detailed description taken in conjunction with the accompanying drawings in which:

FIG. 3 is a diagram for explaining a target block according to an embodiment;

FIG. 4 is a diagram for explaining an inactive state of an integrated circuit according to an embodiment;

FIG. 5 is a diagram for explaining an operation of an internal test mode of an integrated circuit according to an embodiment;

FIG. 6 is a diagram for explaining an operation of an external test mode of an integrated circuit according to an embodiment;

FIG. 7 is a diagram for explaining an operation of a security mode of an integrated circuit according to an embodiment;

Figure 13:
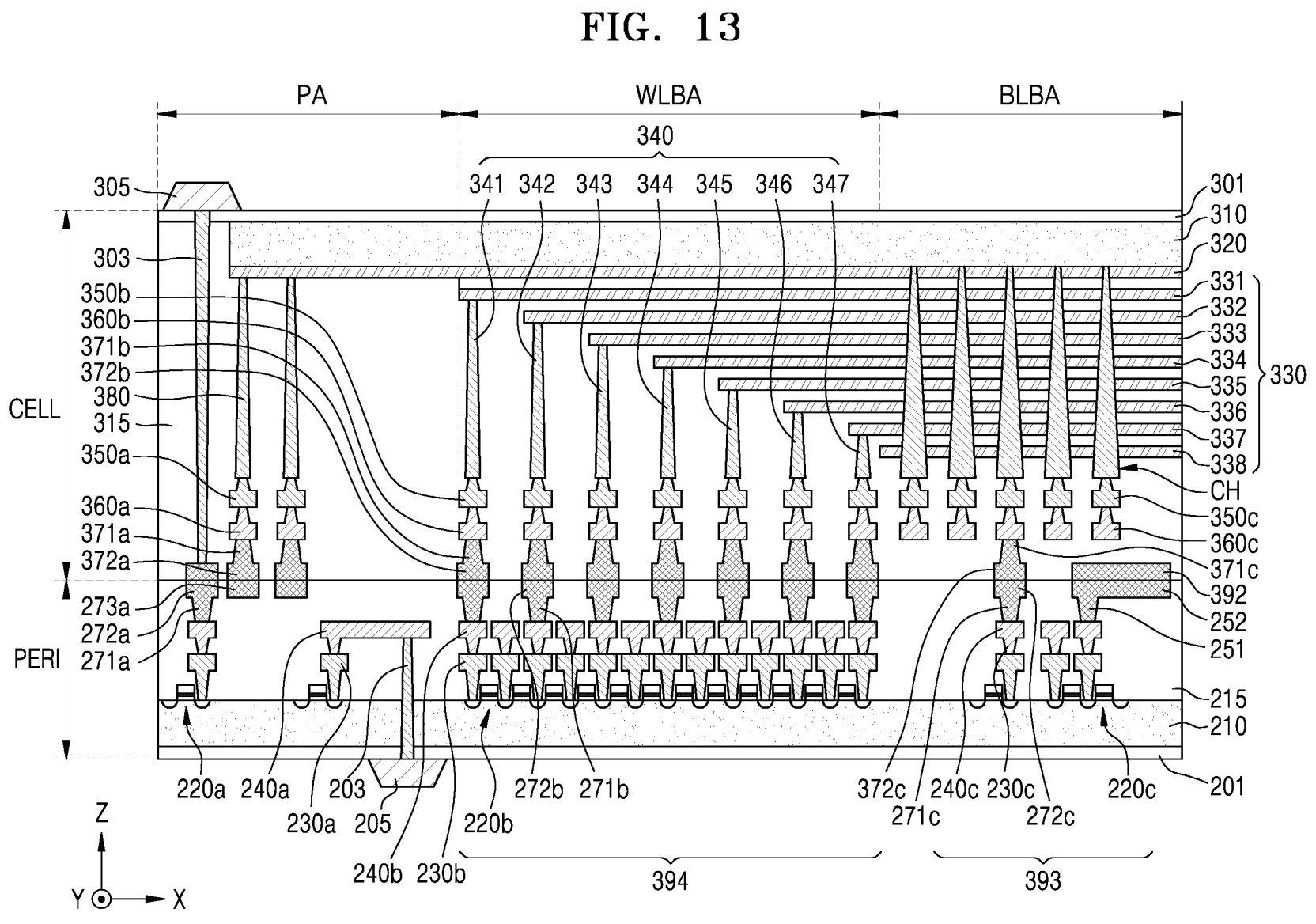

FIGS. 11 to 13 are diagrams for explaining a memory device including an integrated circuit according to an embodiment.

DETAILED DESCRIPTION OF THE EMBODIMENTS

Hereinafter, embodiments of the inventive concept will be described in conjunction with the accompanying drawings. Hereinafter, details such as detailed configuration and structure are provided to aid the reader's understanding of the embodiments of the inventive concept. Therefore, the embodiments described herein may be changed or modified in various ways without departing from the embodiments of the inventive concept.

Figure 1:
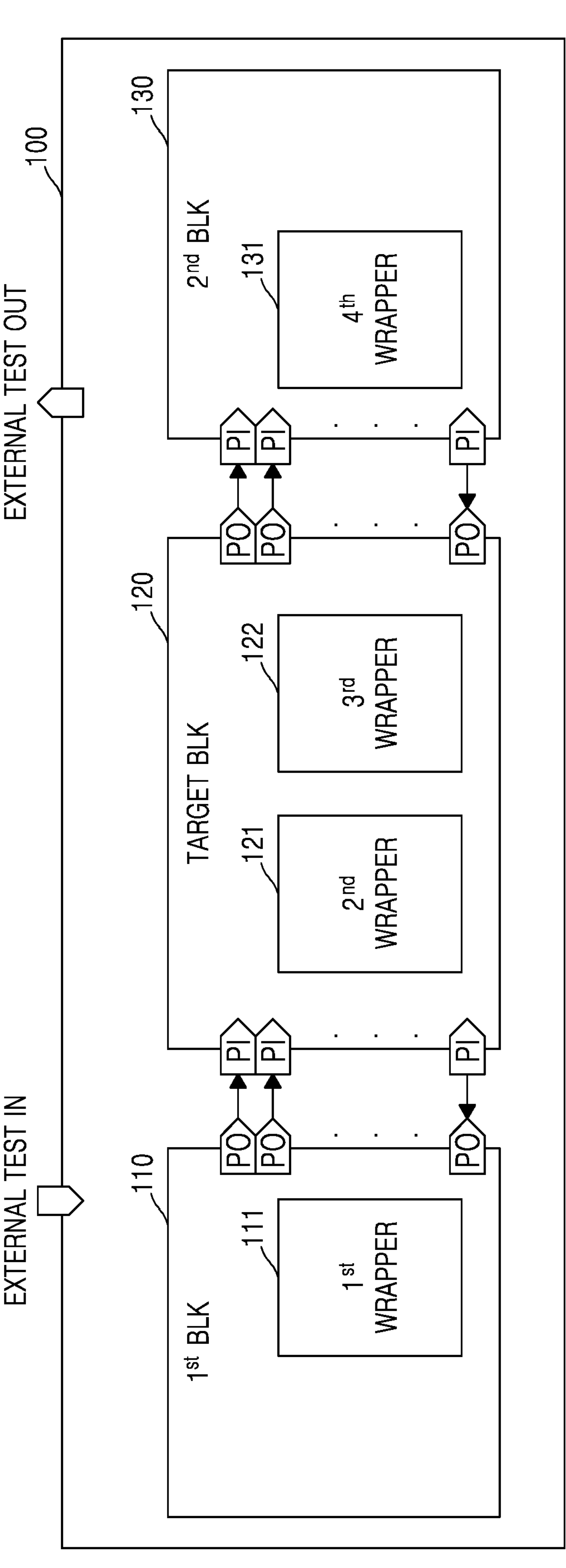
FIGS. 1 and 2 are block diagrams of integrated circuits according to an embodiment.
Figure 2:
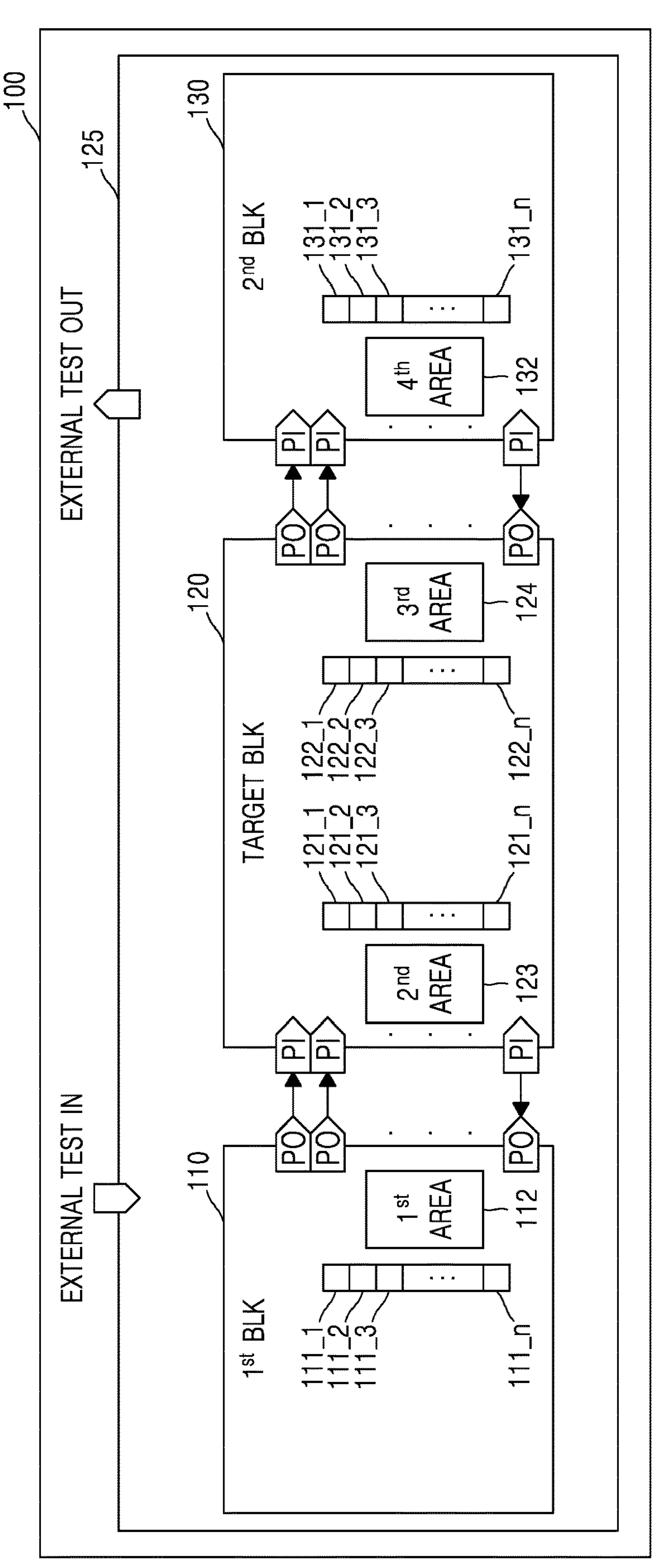

FIGS. 1 and 2 are block diagrams of an integrated circuit 100 according to an embodiment. Referring to FIGS. 1 and 2, the integrated circuit 100 according to an embodiment may include a $1^{st}$ block 110, a target block 120, and a $2^{nd}$ block 130, a test signal input terminal External Test In, and a test signal output terminal External Test Out. In addition, the $1^{st}$ block 110, the target block 120, and the $2^{nd}$ block 130 according to an embodiment may be components included in a core logic 125.

Referring to FIGS. 1 and 2 together, the $1^{st}$ block 110 according to an embodiment may include a $1^{st}$ wrapper 111 and a $1^{st}$ area 112 isolated by the $1^{st}$ wrapper 111. The $1^{st}$ area 112 according to an embodiment may be an arbitrary memory area to be tested. For example, the $1^{st}$ wrapper 111 may isolate the $1^{st}$ area 112 and allow a test signal to be input to the $1^{st}$ area 112 to perform a test on the $1^{st}$ area 112.

The $1^{st}$ wrapper 111 according to an embodiment may include a plurality of first register circuits 111_1, 111_2, 111_3, . . . , **111_*n*. Each of the plurality of register circuits 111_1, 111_2, 111_3, . . . , 111_*n* of the $1^{st}$ wrapper 111 according to an embodiment may shift-in or shift-out a test signal or a wrapping signal. The $1^{st}$ block 110 according to an embodiment may include a plurality of output terminals PO, and may transfer an arbitrary input signal to an external block through the plurality of output terminals PO. In addition, the $1^{st}$ block 110** according to an embodiment may receive an arbitrary input signal received from the outside through the plurality of output terminals PO.

According to an embodiment, the target block 120 may include a $2^{nd}$ wrapper 121 and a $3^{rd}$ wrapper, and include a plurality of input terminals PI and the plurality of output terminals PO. The target block 120 according to an embodiment may include a core logic circuit, and the core logic circuit may be a circuit to be tested. A test operation performed on the core logic circuit is described in detail with reference to FIGS. 3 to 7.

The $2^{nd}$ wrapper 121 according to an embodiment may include a plurality of second register circuits 121_1, 121_2, 121_3, . . . , **121_*n*, and the $2^{nd}$ area 123 may be configured to be positioned between the $1^{st}$ wrapper 111 and the $2^{nd}$ wrapper 121. The $2^{nd}$ area 123 according to an embodiment may be isolated by the $1^{st}$ wrapper 111 and the $2^{nd}$ wrapper 121. The $2^{nd}$ area 123 is isolated by the $1^{st}$ wrapper 111, and thus, a test signal for the test operation may be applied to the $2^{nd}$ area 123 according to an embodiment. For example, the test signal is applied to the $2^{nd}$ area 123 isolated by the $1^{st}$ wrapper 111, and the test signal that has passed through the $2^{nd}$ area 123 is input to the $2^{nd}$ wrapper 121, and thus, the integrated circuit 100 according to an embodiment may detect whether there is an abnormality in the test signal input to the $2^{nd}$ wrapper 121 and determine whether there is an abnormality in the $2^{nd}$ area 123**.

The $3^{rd}$ wrapper 122 according to an embodiment may include a plurality of third register circuits 122_1, 122_2, 122_3, and **122_*n*, and isolate a $3^{rd}$ area 124. The $3^{rd}$ area 124 is isolated by the $3^{rd}$ wrapper 122, and thus, the test operation may be performed on the $3^{rd}$ area 124 according to an embodiment. For example, the test operation on the $3^{rd}$ area 124 may be performed by applying the test signal to the $3^{rd}$ area 124 isolated by the $3^{rd}$ wrapper 122**.

The target block 120 according to an embodiment may include the plurality of input terminals PI and the plurality of output terminals PO, thereby sharing with external blocks and wrappers. For example, the target block 120 receives a signal received from the $1^{st}$ block 110 as an input so that the $1^{st}$ area 112 and the $2^{nd}$ area 123 between the $1^{st}$ wrapper 111 and the $2^{nd}$ wrapper 121 may be isolated, and the test operation may be performed on the $1^{st}$ area 112 and the $2^{nd}$ area 123. In addition, the target block 120 may output an output signal to the $2^{nd}$ block 130, allow the $3^{rd}$ area 124 and a $4^{th}$ area 132 between the $3^{rd}$ wrapper 122 and the $4^{th}$ wrapper 131 to be isolated, and allow the test operation to be performed on the $3^{rd}$ area 124 and the $4^{th}$ area 132.

According to an embodiment, the $2^{nd}$ block 130 may include a $4^{th}$ wrapper 131, the $4^{th}$ area 132 isolated by the $4^{th}$ wrapper 131, and the plurality of input terminals PI.

The $4^{th}$ wrapper 131 according to an embodiment may include a plurality of fourth register circuits 131_1, 131_2, 131_3, . . . , **131_*n*, and isolate the $4^{th}$ area 132. The $4^{th}$ area 132 is isolated by the $4^{th}$ wrapper 131, so that the test operation may be performed on the $4^{th}$ area 132 according to an embodiment. For example, the test operation may be performed on the $4^{th}$ area 132 by applying a test signal to the $4^{th}$ area 132 isolated by the $4^{th}$ wrapper 132**.

The $1^{st}$ wrapper 111, the $2^{nd}$ wrapper 121, the $3^{rd}$ wrapper 122, and the $4^{th}$ wrapper 131 according to an embodiment may be connected to each other to form a wrapper chain. For example, the $1^{st}$ wrapper 111, the $2^{nd}$ wrapper 121, the $3^{rd}$ wrapper 122, and the $4^{th}$ wrapper 131 may be connected to each other and share a wrapping signal or a test signal input from the outside. The $1^{st}$ wrapper 111 according to an embodiment may receive a wrapping signal or a test signal and transmit the input wrapping signal or test signal to the connected $2^{nd}$ wrapper 121. The $2^{nd}$ wrapper 121 according to an embodiment may transmit the received wrapping signal or test signal to the connected $3^{rd}$ wrapper 122. The $3^{rd}$ wrapper 122 according to an embodiment may transmit the received wrapping signal or test signal to the connected $4^{th}$ wrapper 131. The $4^{th}$ wrapper 131 according to an embodiment may shift-out and output the received wrapping signal or test signal.

The integrated circuit 100 according to an embodiment forms the wrapper chain through the $1^{st}$ wrapper 111, the $2^{nd}$ wrapper 121, the $3^{rd}$ wrapper 122, and the $4^{th}$ wrapper 131 with respect to each of the $1^{st}$ block 110, the target block 120, and the $3^{rd}$ block 130 included therein, thereby isolating an edge area of each of the $1^{st}$ block 110, the target block 120, and the $3^{rd}$ block 130, and as a result of isolating the edge area of each of the $1^{st}$ block 110, the target block 120, and the $3^{rd}$ block 130, the test operation may be performed on the edge area, and thus, the performance of a memory device may be improved.

FIG. 3 is a diagram for explaining a target block 125 according to an embodiment. The core logic 125 according to an embodiment may be a block including a target block to be tested. Referring to FIGS. 1 and 3 together, the core logic 125 according to an embodiment may include the $2^{nd}$ wrapper 121 and the $3^{rd}$ wrapper 122. In addition, the $2^{nd}$ wrapper 121 may include a plurality of second register circuits 121_1, 121_2, 121_3, . . . , **121_*n*, the $3^{rd}$ wrapper 122 may include a plurality of third register circuits 122_1, 122_2, 122_3, . . . , 122_*n*, and the $2^{nd}$ wrapper 121 and the $3^{rd}$ wrapper 122 may be connected to each other to form a wrapper chain. The $2^{nd}$ wrapper 121 and the $3^{rd}$ wrapper 122 according to an embodiment may form the wrapper chain and isolate the core logic 125**.

The core logic 125 according to an embodiment may be configured to receive a first wrapping signal Wrp_Sig1 through an arbitrary input terminal PI, and input the received first wrapping signal Wrp_Sig1 to the second register circuits 121_1, 121_2, 121_3, . . . , **121_*n* of the $2^{nd}$ wrapper 121. The first wrapping signal Wrp_Sig1 according to an embodiment may be input to the wrapper chain to isolate a test area in the core logic 125. When the test area is isolated, a first test signal Test_Sig1 may be input to the core logic 125 according to an embodiment, and the input first test signal Test_Sig1 may be input to the wrapper chain, so that a test operation may be performed on the core logic 125**.

The core logic 125 according to an embodiment may be a logic circuit to be tested including a target block. For example, the core logic 125 may receive the first test signal Test_Sig1 and output a test output signal Test_So with respect to the first test signal Test_Sig1. The core logic 125 according to an embodiment may output the test output signal Test_So to the arbitrary output terminal PO. Also, the core logic 125 according to an embodiment may output a wrapping output signal Wrp_So to the arbitrary output terminal PO.

In the embodiments of FIGS. 1 and 3, only the first test signal Test_Sig1 is illustrated as a test signal input to the core logic 125, but is not limited thereto. In addition, only the first wrapping signal Wrp_Sig1 is illustrated as a wrapping signal input to the $2^{nd}$ wrapper 121, but is not limited thereto. In addition, the $2^{nd}$ wrapper 121 and the $3^{rd}$ wrapper 122 disclosed in FIG. 3 may be configured to be included in the core logic 125. When the $2^{nd}$ wrapper 121 and the $3^{rd}$ wrapper 122 are configured to be included in the core logic 125, the $2^{nd}$ wrapper 121 and the $3^{rd}$ wrapper 122 according to an embodiment may be connected to wrappers included in an external block, and thus, an edge area of the core logic 125 may be isolated.

FIG. 4 is a diagram for explaining an inactive state of the integrated circuit 100 according to an embodiment. Referring to FIG. 4, a top logic 10 according to an embodiment may include the integrated circuit 100 in the inactive state and top level logic circuits 11 and 12. The top level logic circuits 11 and 12 according to an embodiment are not the core logic 125 to be tested, but may be logic circuits for driving the core logic circuit 125.

In the integrated circuit 100 in the inactive state according to an embodiment, the $1^{st}$ to $4^{th}$ wrappers 111, 121, 122, and 131 may be in the inactive state. When the $1^{st}$ to $4^{th}$ wrappers 111, 121, 122, and 131 are in the inactive state, the $1^{st}$ to $4^{th}$ wrappers 111, 121, 122, and 131 according to an embodiment may pass input signals with respect to the core logic circuit 125 therethrough. For example, the $1^{st}$ to $4^{th}$ wrappers 111, 121, 122, and 131 may directly transmit an input signal to the core logic circuit 125 without performing a shift-in operation on any input signal with respect to the core logic circuit 125 so that the core logic circuit 125 may be driven.

When the $1^{st}$ to $4^{th}$ wrappers 111, 121, 122, and 131 according to an embodiment are in the inactive state, the $1^{st}$ to $4^{th}$ wrappers 111, 121, 122, and 131 are not connected to each other, and a wrapper chain may also be in the inactive state Also, the core logic circuit 125 according to an embodiment may receive a clock signal CLK from the outside and output an output signal with respect to the clock signal CLK to the top level logic circuits 11 and 12. Moreover, when the $1^{st}$ to $4^{th}$ wrappers 111, 121, 122, and 131 according to an embodiment are in the inactive state, even though the first test signal Test_Sig1 and the first wrapping signal Wrp_Sig1 are input, the test output signal Test_So and the wrapping output signal Wrp_So may not be generated.

FIG. 5 is a diagram for explaining an operation of an internal test mode of the integrated circuit 100 according to an embodiment. Referring to FIGS. 1 and 5 together, the top logic 10 according to an embodiment may include the integrated circuit 100 in the internal test mode, the top level logic circuits 11 and 12, and an active wrapper chain. The top level logic circuits 11 and 12 according to an embodiment are not the core logic circuit 125 to be tested, but may be logic circuits for driving the core logic circuit 125. The internal test mode according to an embodiment may be a mode in which a test operation is performed on the core logic circuit 125.

In the integrated circuit 100 in the internal test mode according to an embodiment, the $2^{nd}$ wrapper 121 may be configured to input a test signal input from the outside to the core logic circuit 125, and the $3^{rd}$ wrapper 122 may be configured to extract an output value with respect to the test signal to the core logic circuit 125. The integrated circuit 100 in the internal test mode according to an embodiment may receive the first test signal Test_Sig1 and the first wrapping signal Wrp_Sig1 from the outside and perform the test operation on the core logic circuit 125. For example, the second register circuits 121_1, 121_2, 121_3, . . . , **121_*n* and the third register circuits 122_1, 122_2, 122_3, . . . , 122_*n* of the $2^{nd}$ wrapper 121 may receive the first wrapping signal Wrp_Sig1 and activate the wrapper chain, thereby isolating the core logic circuit 125**.

In the internal test mode, outputs of the third register circuits 122_1, 122_2, 122_3, . . . , **122_*n* according to an embodiment with respect to the first wrapping signal Wrp_Sig1 and an output of the core logic circuit 125 with respect to the first test signal Test_Sig1 may be monitored. For example, the outputs of the third register circuits 122_1, 122_2, 122_3, . . . , 122_*n* with respect to the first wrapping signal Wrp_Sig1 may be monitored as having logic values of 1 and 0, and the output of the core logic circuit 125 with respect to the first test signal Test_Sig1 may be monitored as having a logic value of 1. However, the monitored logic values are not limited thereto, and all of outputs of respective register circuits may be monitored, and the output of the core logic circuit 125** may also have a different logic value.

The outputs of the third register circuits 122_1, 122_2, 122_3, . . . , **122_*n* according to an embodiment may be shift-out values. In the internal test mode, the integrated circuit 100 according to an embodiment may monitor the output values of the core logic circuit 125 and the third register circuits 122_1, 122_2, 122_3, 122_*n*, and thus, test results of the core logic circuit 125** may be monitored.

FIG. 6 is a diagram for explaining an operation of an external test mode of the integrated circuit 100 according to an embodiment. Referring to FIGS. 1 and 6 together, the top logic 10 according to an embodiment may include the integrated circuit 100 in the external test mode, the top level logic circuits 11 and 12, and an active wrapper chain. The top level logic circuits 11 and 12 according to an embodiment are not the core logic circuit 125 to be tested, but may be logic circuits for driving the core logic circuit 125. The external test mode according to an embodiment may be a mode in which a test is performed on the outside of the core logic circuit 125.

The $2^{nd}$ wrapper 121 of the integrated circuit 100 in the external test mode according to an embodiment may be configured to extract a test signal input from the outside, and the $3^{rd}$ wrapper 122 may be configured to output an output signal with respect to the test signal of the core logic circuit 125. The integrated circuit 100 according to an embodiment may be configured to monitor the test signal input to the $2^{nd}$ wrapper 121 in the external test mode.

The integrated circuit 100 in the external test mode according to an embodiment may receive the first test signal Test_Sig1 and the first wrapping signal Wrp_Sig1 from the outside and perform a test operation on external areas of the core logic circuit 125. For example, the second register circuits 121_1, 121_2, 121_3, . . . , **121_*n* and the third register circuits 122_1, 122_2, 122_3, . . . , 122_*n* of the $2^{nd}$ wrapper 121 may receive the first wrapping signal Wrp_Sig1 and activate the wrapper chain, thereby isolating the core logic circuit 125 and performing the test operation on the outside of the core logic circuit 125**.

In the external test mode, inputs to the second register circuits 121_1, 121_2, 121_3, . . . , **121_*n* according to an embodiment and an input to the core logic circuit 125 may be monitored. For example, the inputs to the second register circuits 121_1, 121_2, 121_3, . . . , 121_*n* may be monitored as having a logic value of 1, and the input to the core logic circuit 125** may be monitored as having a logic value of 0. However, the monitored logic values are not limited thereto, and all of inputs to respective register circuits may be monitored and may have different logic values.

Inputs to the third register circuits 122_1, 122_2, 122_3, . . . , 122_n according to an embodiment may be shift-in values. In the external test mode, the integrated circuit 100 according to an embodiment may monitor input values of the core logic circuit 125 and the third register circuits 122_1, 122_2, 122_3, . . . , 122_n, and thus, test results with respect to the outside of the core logic circuit 125 may be monitored.

FIG. 7 is a diagram for explaining an operation of a security mode of the integrated circuit 100 according to an embodiment. Referring to FIGS. 1 and 7 together, in the security mode, the $2^{nd}$ wrapper 121 and the $3^{rd}$ wrapper 122 according to an embodiment may each receive a security signal and block an input signal to the core logic circuit 125. Also, in the security mode of operation, both an input and an output to the core logic circuit 125 may be monitored. For example, in the security mode, inputs to the second register circuits 121_1, 121_2, 121_3, . . . , 121_n and the input to the core logic circuit 125 may be monitored. For example, the inputs to the second register circuits 121_1, 121_2, 121_3, . . . , 121_n may be monitored as having a logic value of 1, and the input to the core logic circuit 125 may be monitored as having a logic value of 0. However, the monitored logic values are not limited thereto, and all of inputs to respective register circuits may be monitored and may have different logic values.

Also, in the security mode, outputs of the third register circuits 122_1, 122_2, 122_3, . . . , 122_n according to an embodiment with respect to the first wrapping signal Wrp_Sig1 and an output of the core logic circuit 125 with respect to the first test signal Test_Sig1 may be monitored. For example, the outputs of the third register circuits 122_1, 122_2, 122_3, . . . , 122_n according to an embodiment with respect to the first wrapping signal Wrp_Sig1 may be monitored as having logic values of 1 and 0, and the output of the core logic circuit 125 with respect to the first test signal Test_Sig1 may be monitored as having a logic value of 1. However, the monitored logic values are not limited thereto, all of outputs of respective register circuits may be monitored, and an output value of the core logic circuit 125 may also have a different logic value.

The integrated circuit 100 according to an embodiment in the security mode may monitor the inputs to the second register circuits 121_1, 121_2, 121_3, . . . , 121_n and the input to the core logic circuit 125, and monitor both the outputs of the third register circuits 122_1, 122_2, 122_3, . . . , 122_n with respect to the first wrapping signal Wrp_Sig1 and the output of the core logic circuit 125 with respect to the first test signal Test_Sig1, thereby blocking any input signal to the core logic circuit 125.

Figure 8:
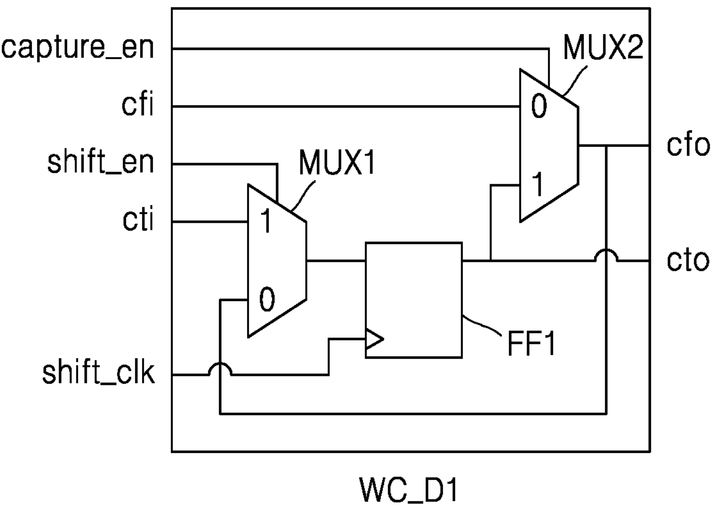
FIGS. 8 and 9 are diagrams for explaining register circuits included in a wrapper according to an embodiment.
Figure 9:
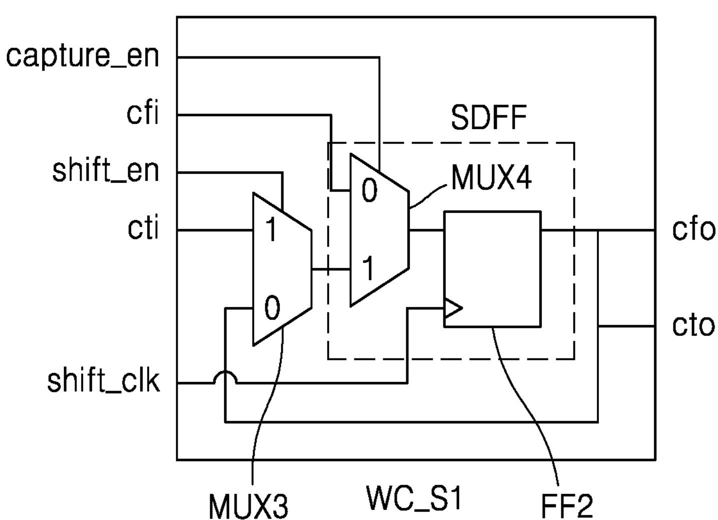

FIGS. 8 and 9 are diagrams for explaining register circuits included in a wrapper according to an embodiment. In particular, a register circuit WC_D1 according to the embodiment of FIG. 8 may be present in an internal area of an integrated circuit, and a register circuit WC_S1 according to the embodiment of FIG. 9 may be present in an edge area of the integrated circuit.

Referring to FIG. 8, the register circuit WC_D1 according to an embodiment may include a first multiplexer MUX1 receiving a data shift enable signal Shift_en, a second multiplexer MUX2 receiving a data capture enable signal capture_en, and a first flip-flop FF1 extracting captured data. The first multiplexer MUX1 according to an embodiment may receive the data shift enable signal Shift_en and then a cell test signal Cti. The first multiplexer MUX1 according to an embodiment may activate the first flip-flop FF1 by receiving the data shift enable signal Shift_en and then the cell test signal Cti.

The second multiplexer MUX2 according to an embodiment may capture data stored in the first flip-flop FF1 and generate a cell function output signal Cfo by receiving the data capture enable signal capture_en and then the cell function input signal Cfi. According to an embodiment, the first flip-flop FF1 may receive a shift clock Shift_clk and output the stored data as a data test output signal Cto.

In the embodiment of FIG. 8, the first multiplexer MUX1 and the second multiplexer MUX2 may be disposed with the first flip-flop FF1 disposed therebetween. When the first multiplexer MUX1 and the second multiplexer MUX2 are disposed with the first flip-flop FF1 disposed therebetween, it is difficult to connect the first multiplexer MUX1 and the second multiplexer MUX2 to a register circuit of an external block.

Referring to FIG. 9 compared with FIG. 8, the register circuit WC_S1 according to an embodiment may include a third multiplexer MUX3 receiving the data shift enable signal Shift_en, a fourth multiplexer MUX4 receiving the data capture enable signal Capture_en, and a second flip-flop FF2 extracting captured data. Unlike the embodiment of FIG. 8, in the embodiment of FIG. 9, the fourth multiplexer MUX4 may be disposed to be directly connected to the third multiplexer MUX3, and the second flip-flop FF2 may be disposed to be connected to the fourth multiplexer MUX4.

The third multiplexer MUX3 according to an embodiment may receive the data shift enable signal Shift_en and then the cell test signal Cti. The third multiplexer MUX3 according to an embodiment may receive the data shift enable signal Shift_en and the cell test signal Cti, and transmit an output signal to the fourth multiplexer MUX4.

The fourth multiplexer MUX4 according to an embodiment may capture the data stored in the second flip-flop FF2 and generate the cell function output signal Cfo by receiving the data capture enable signal capture_en and then the cell function input signal Cfi. The second flip-flop FF2 according to an embodiment may receive the shift clock Shift_clk and output stored data as the data test output signal Cto.

In the embodiment of FIG. 9, the fourth multiplexer MUX4 is disposed to be directly connected to the third multiplexer MUX3 and the second flip-flop FF2 is disposed to be connected to the fourth multiplexer MUX4, and thus, the register circuit WC_S1 may be connected to a register circuit of an external block. The external register circuit is connected to the register circuit WC_S1 of FIG. 9, and thus, the core logic circuit 125 of FIG. 3 may share the register circuit WC_S1 with any external core logic circuit.

Figure 10:
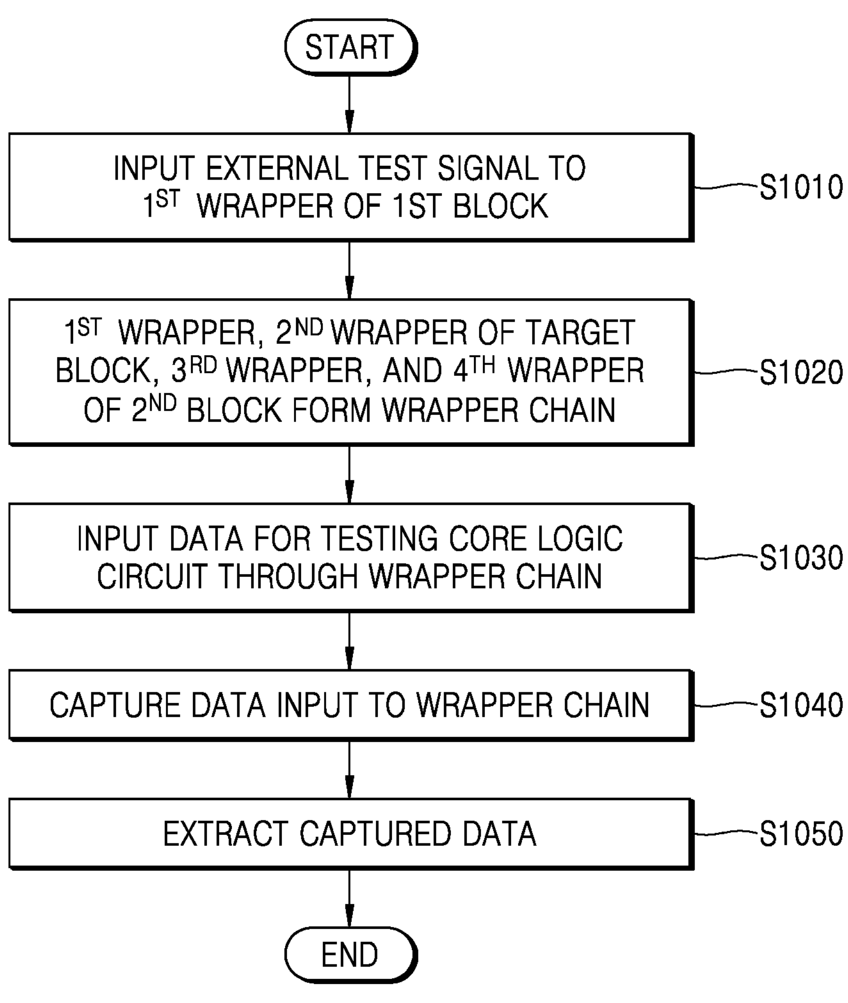
FIG. 10 is a flowchart of operating method of operating an integrated circuit, according to an embodiment.

FIG. 10 is a flowchart of a method of operating an integrated circuit according to an embodiment. Referring to FIGS. 1 and 10 together, an external test signal may be input to the $1^{st}$ wrapper 111 of the $1^{st}$ block 110 present in the integrated circuit 100 according to an embodiment (S1010).

The integrated circuit 100 according to an embodiment may allow a test signal to be input to the $1^{st}$ area 112 so that a test may be performed on the $1^{st}$ area 112. For example, the $1^{st}$ wrapper 111 may isolate the $1^{st}$ area 112 and allow the test signal to be input to the $1^{st}$ area 112 so that the test may be performed on the $1^{st}$ area 112.

When the test signal is input to the $1^{st}$ wrapper 111, the $1^{st}$ wrapper 111, the $2^{nd}$ wrapper 121 of the target block 120, the $3^{rd}$ wrapper 122, and the $4^{th}$ wrapper 131 of the $2^{nd}$ block according to an embodiment may form a wrapper chain (S1020).

The 1$^{st}$ wrapper 111, the 2$^{nd}$ wrapper 121, the 3$^{rd}$ wrapper 122, and the 4$^{th}$ wrapper 131 according to an embodiment may be connected to each other to form the wrapper chain. For example, the 1$^{st}$ wrapper 111, the 2$^{nd}$ wrapper 121, the 3$^{rd}$ wrapper 122, and the 4$^{th}$ wrapper 131 may be connected to each other and share a wrapping signal or a test signal input from the outside. And, when the wrapper chain is formed, data for testing a core logic circuit may be input through the wrapper chain according to an embodiment (S1030).

The 1$^{st}$ wrapper 111 according to an embodiment may receive a wrapping signal or test signal and transmit the received wrapping signal or test signal to the connected 2$^{nd}$ wrapper 121. The 2$^{nd}$ wrapper 121 according to an embodiment may transmit the received wrapping signal or test signal to the connected 3$^{rd}$ wrapper 122. The 3$^{rd}$ wrapper 122 according to an embodiment may transmit the received wrapping signal or test signal to the connected 4$^{th}$ wrapper 131. The 4$^{th}$ wrapper 131 according to an embodiment may shift out and output the received wrapping signal or test signal.

When data is input, the integrated circuit 100 according to an embodiment may capture the data input to the wrapper chain (S1040). The integrated circuit 100 according to an embodiment may receive a data capture enable signal and capture data stored in an area to be tested. Then, when the data is captured, the integrated circuit 100 according to an embodiment may extract the captured data (S1050). For example, in an internal test mode with respect to a core logic circuit, the integrated circuit 100 may extract data output from a register circuit and monitor a data value. Also, in an external test mode with respect to the core logic circuit, the integrated circuit 100 may extract data input to the register circuit and monitor a data value. As described in the flow diagram of FIG. 10, the integrated circuit 100 according to an embodiment may form the wrapper chain that isolates the core logic circuit, so that a test operation may be performed up to an edge area of the core logic circuit.

Figure 11:
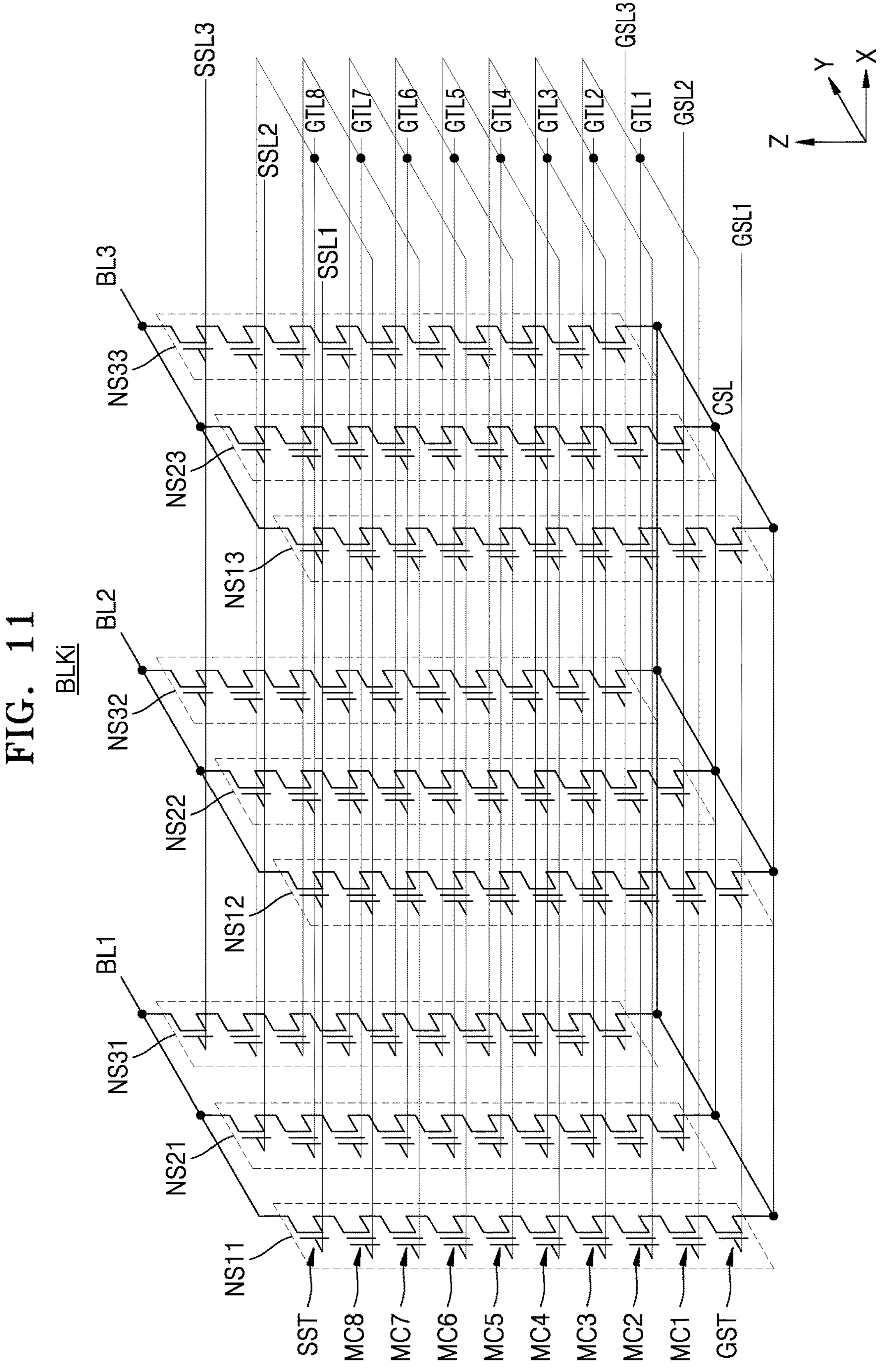
Figure 12:
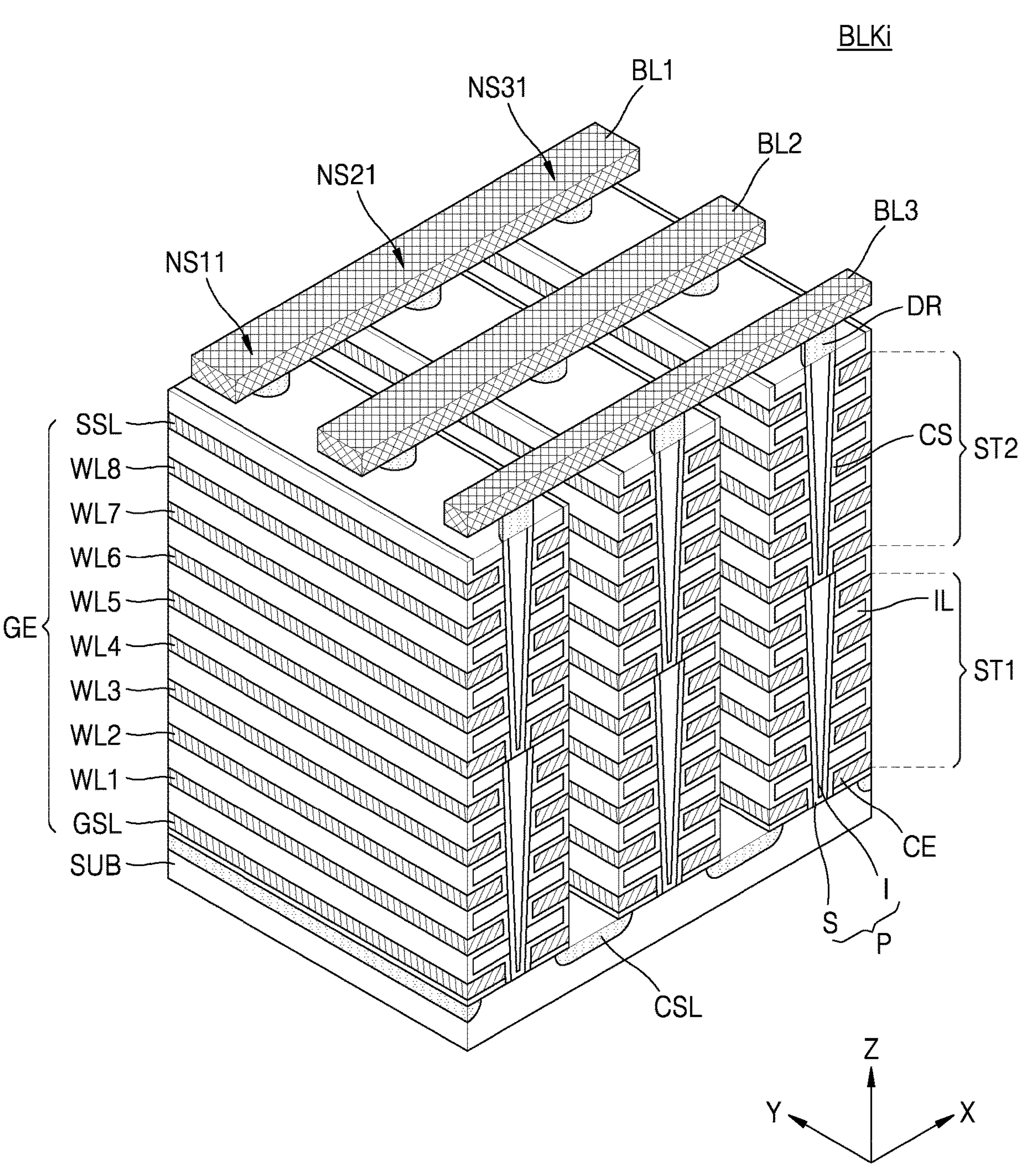

FIGS. 11 to 13 are diagrams for explaining a memory device including an integrated circuit according to an embodiment. Referring to FIGS. 11 to 13, the memory device to which the integrated circuits 100 and 10 of FIGS. 1 to 9 may be utilized may have a 3D V-NAND structure. A first nonvolatile memory applicable to the memory device may include a plurality of memory blocks. FIGS. 11 and 12 illustrate a structure of one memory block BLKi among a plurality of memory blocks, and FIG. 13 illustrates an implementation example of a nonvolatile memory.

Referring to FIG. 11, the memory block BLKi may include a plurality of memory NAND strings NS11 to NS33 connected between bit lines BL1, BL2, and BL3 and a common source line CSL. Each of the plurality of memory NAND strings NS11 to NS33 may include a string selection transistor SST, a plurality of memory cells MC1 to MC8, and a ground selection transistor GST. For brevity of the drawing, FIG. 10 illustrates that each of the plurality of memory NAND strings NS11 to NS33 includes the eight memory cells MC1 to MC8, but is not necessarily limited thereto.

The string selection transistor SST may be connected to string selection lines SSL1, SSL2, and SSL3 corresponding thereto. The plurality of memory cells MC1 to MC8 may be respectively connected to gate lines GTL1 to GTL8 corresponding thereto. The gate lines GTL1 to GTL8 may correspond to word lines, and some of the gate lines GTL1 to GTL8 may correspond to dummy word lines. The ground selection transistor GST may be connected to ground selection lines GSL1, GSL2, and GSL3 corresponding thereto. The string selection transistor SST may be connected to bit lines BL1, BL2, and BL3 corresponding thereto, and the ground selection transistor GST may be connected to the common source line CSL.

Gate lines (e.g., GTL1) having the same height may be connected in common, and the ground selection lines GSL1, GSL2, and GSL3 and the string selection lines SSL1, SSL2, and SSL3 may be separated from each other. FIG. 10 illustrates that the memory block BLK is connected to the eight gate lines GTL1 to GTL8 and the three bit lines BL1, BL2, and BL3, but is not necessarily limited thereto.

Referring further to FIG. 12, the memory block BLKi is formed in a direction perpendicular to a substrate SUB. Memory cells constituting the memory NAND strings NS11 to NS33 are formed by stacking in a plurality of semiconductor layers. The common source line CSL extending in a first direction (Y direction) is provided on the substrate SUB. On an area of the substrate SUB between two adjacent common source lines CSL, a plurality of insulating films IL extending in the first direction (Y direction) may be sequentially provided in a third direction (Z direction) and may be spaced apart by a specific distance in the third direction (Z direction). On the area of the substrate SUB between two adjacent common source lines CSL, a plurality of pillars P are provided by being sequentially disposed in the first direction (Y direction) and penetrating the plurality of insulating layers IL in the third direction (Z direction). The plurality of pillars P may contact the substrate SUB by penetrating the plurality of insulating layers IL. A surface layer S of each of the pillars P may include a silicon material doped with a first conductivity type, and may function as a channel area.

An inner layer I of each of the pillars P may include an insulating material such as silicon oxide or an air gap. In the area between two adjacent common source lines CSL, a charge storage layer CS is provided along the insulating layers IL, the pillars P, and an exposed surface of the substrate SUB. The charge storage layer CS may include a gate insulating layer (or referred to as 'tunneling insulating layer'), a charge trap layer, and a blocking insulating layer. In addition, in the area between two adjacent common source lines CSL, on an exposed surface of the charge storage layer CS, a gate electrode GE such as the selection lines GSL and SSL and the word lines WL1 to WL8 is provided. Drains or drain contacts DR may be provided on the plurality of pillars P, respectively. The bit lines BL1 to BL3 extending in the second direction (X direction) and spaced apart from each other by a specific distance in the first direction (Y direction) may be provided on the drain contacts DR.

As shown in FIG. 12, each of the memory NAND strings NS11 to NS33 may be implemented in a structure in which a first memory stack ST1 and a second memory stack ST2 are stacked. The first memory stack ST1 is connected to the common source line CSL, the second memory stack ST2 is connected to the bit lines BL1 to BL3, and the first memory stack ST1 and the second memory stack ST2 are stacked to share a channel hole with each other.

Referring further to FIG. 13, the nonvolatile memory may have a chip to chip (C2C) structure. The C2C structure may mean manufacturing an upper chip including a cell area CELL on a first wafer, manufacturing a lower chip including a peripheral circuit area PERI on a second wafer different from the first wafer, and then connecting the upper chip and the lower chip to each other by a bonding method. For example, the bonding method may mean a method of electrically connecting a bonding metal formed on the uppermost metal layer of the upper chip and a bonding metal formed on the uppermost metal layer of the lower chip to each other. For example, when the bonding metal includes copper (Cu), the bonding method may be a Cu—Cu bonding method, and the bonding metal may also include aluminum (Al) or tungsten (W).

Each of the peripheral circuit area PERI and the cell area CELL of the nonvolatile memory may include an external pad bonding area PA, a word line bonding area WLBA, and a bit line bonding area BLBA. The peripheral circuit area PERI may include a first substrate 210, an interlayer insulating layer 215, a plurality of circuit devices 220*a*, 220*b*, and 220*c* formed on the first substrate 210, first metal layers 230*a*, 230*b*, and 230*c* respectively connected to the plurality of circuit devices 220*a*, 220*b*, and 220*c*, and second metal layers 240*a*, 240*b*, and 240*c* respectively formed on the first metal layers 230*a*, 230*b*, and 230*c*. In an embodiment, the first metal layers 230*a*, 230*b*, and 230*c* may include tungsten having a relatively high electrical resistivity, and the second metal layers 240*a*, 240*b*, and 240*c* may include copper having a relatively low electrical resistivity.

In the present specification, only the first metal layers 230*a*, 230*b*, and 230*c* and the second metal layers 240*a*, 240*b*, and 240*c* are illustrated and described, but are not limited thereto, and one or more metal layers may be further formed the second metal layers 240*a*, 240*b*, and 240*c*. At least some of the one or more metal layers formed on the second metal layers 240*a*, 240*b*, and 240*c* may include aluminum having a lower electrical resistivity than that of copper forming the second metal layers 240*a*, 240*b*, and 240*c*.

The interlayer insulating layer 215 may be disposed on the first substrate 210 to cover the plurality of circuit devices 220*a*, 220*b*, and 220*c*, the first metal layers 230*a*, 230*b*, and 230*c*, and the second metal layers 240*a*, 240*b*, and 240*c*, and may include an insulating material such as silicon oxide or silicon nitride.

Lower bonding metals 271*b* and 272*b* may be formed on the second metal layer 240*b* of the word line bonding area WLBA. In the word line bonding area WLBA, the lower bonding metals 271*b* and 272*b* of the peripheral circuit area PERI may be electrically connected to upper bonding metals 371*b* and 372*b* of the cell area CELL by the bonding method, and the lower bonding metals 271*b* and 272*b* and the upper bonding metals 371*b* and 372*b* may include aluminum, copper, or tungsten.

The cell area CELL may provide at least one memory block. The cell area CELL may include a second substrate 310 and a common source line 320. A plurality of word lines 330:331 to 338 may be stacked on the second substrate 310 in a direction (Z-axis direction) perpendicular to an upper surface of the second substrate 310. String selection lines and a ground selection line may be disposed on upper and lower portions of the word lines 330, and the word lines 330 may be disposed between the string selection lines and the ground selection line.

In the bit line bonding area BLBA, a channel structure CH may extend in the direction (Z-axis direction) perpendicular to the upper surface of the second substrate 310 and penetrate the word lines 330, the string selection lines, and the ground selection line. The channel structure CH may include a data storage layer, a channel layer, and a filling insulating layer, and the channel layer may be electrically connected to a first metal layer 350*c* and a second metal layer 360*c*. For example, the first metal layer 350*c* may be a bit line contact, and the second metal layer 360*c* may be a bit line. In an embodiment, the bit line 360*c* may extend in a first direction (Y-axis direction) parallel to the upper surface of the second substrate 310.

An area where the channel structure CH and the bit line 360*c* are disposed may be defined as the bit line bonding area BLBA. The bit line 360*c* may be electrically connected to the circuit devices 220*c* providing a page buffer 393 in the peripheral circuit area PERI of the bit line bonding area BLBA. For example, the bit line 360*c* may be connected to the upper bonding metals 371*c* and 372*c* in the peripheral circuit area PERI, and the upper bonding metals 371*c* and 372*c* may be respectively connected to the connected lower bonding metals 271*c* and 272*c* connected to the circuit devices 220*c* of the page buffer 393.

In the word line bonding area WLBA, the word lines 330 may extend in a second direction (X-axis direction) perpendicular to the first direction and parallel to the upper surface of the second substrate 310, and may be respectively connected to a plurality of cell contact plugs 340:341 to 347. The word lines 330 and the cell contact plugs 340 may be connected to each other through pads provided by extending at least some of the word lines 330 with different lengths in the second direction. The first metal layer 350*b* and the second metal layer 360*b* may be sequentially connected to upper portions of the cell contact plugs 340 respectively connected to the word lines 330. The cell contact plugs 340 may be connected to the peripheral circuit area PERI through the upper bonding metals 371*b* and 372*b* of the cell area CELL and the lower bonding metals 271*b* and 272*b* of the peripheral circuit area PERI in the word line bonding area WLBA.

The cell contact plugs 340 may be electrically connected to the circuit devices 220*b* providing a row decoder 394 in the peripheral circuit area PERI. In an embodiment, an operating voltage of the circuit devices 220*b* forming the row decoder 394 may be different from the operating voltage of the circuit devices 220*c* forming the page buffer 393. For example, the operating voltage of the circuit devices 220*c* forming the page buffer 393 may be greater than the operating voltage of the circuit devices 220*b* forming the row decoder 394.

A common source line contact plug 380 may be disposed in the external pad bonding area PA. The common source line contact plug 380 may include metal, metal compound, or a conductive material such as polysilicon, and may be electrically connected to the common source line 320. The first metal layer 350*a* and the second metal layer 360*a* may be sequentially stacked on the common source line contact plug 380. For example, an area where the common source line contact plug 380, the first metal layer 350*a*, and the second metal layer 360*a* are disposed may be defined as an external pad bonding area PA.

Meanwhile, first and second input/output pads 205 and 305 may be disposed in the external pad bonding area PA. A lower insulating layer 201 covering a lower surface of the first substrate 210 may be formed in a lower portion of the first substrate 210, and the first input/output pad 205 may be formed on the lower insulating layer 201. The first input/output pad 205 may be connected to at least one of the plurality of circuit devices 220*a*, 220*b*, and 220*c* disposed in the peripheral circuit area PERI through a first input/output contact plug 203, and may be separated from the first substrate 210 by the lower insulating layer 201. In addition, a side insulating layer may be disposed between the first input/output contact plug 203 and the first substrate 210 to electrically separate the first input/output contact plug 203 from the first substrate 210.

An upper insulating layer 301 covering the upper surface of the second substrate 310 may be formed in an upper portion of the second substrate 310, and the second input/output pads 305 may be disposed on an upper insulating layer 301. The second input/output pad 305 may be connected to at least one of the plurality of circuit devices 220*a*, 220*b*, and 220*c* disposed in the peripheral circuit area PERI through a second input/output contact plug 303. In an embodiment, the second input/output pad 305 may be electrically connected to the circuit device 220*a*.

According to some embodiments, the second substrate 310 and the common source line 320 may not be disposed in an area where the second input/output contact plug 303 is disposed. Also, the second input/output pad 305 may not overlap the word lines 330 in a third direction (Z-axis direction). The second input/output contact plug 303 may be separated from the second substrate 310 in a direction parallel to the upper surface of the second substrate 310, penetrate the interlayer insulating layer 315 of the cell area CELL, and connected to the second input/output contact pad 305.

According to some embodiments, the first input/output pad 205 and the second input/output pad 305 may be selectively formed. For example, the nonvolatile memory may include only the first input/output pad 205 disposed on the upper portion of the first substrate 210 or only the second input/output pad 305 disposed on the upper portion of the second substrate 310. Alternatively, the nonvolatile memory may include both the first input/output pad 205 and the second input/output pad 305.

In each of the external pad bonding area PA and the bit line bonding area BLBA included in each of the cell area CELL and the peripheral circuit area PERI, a metal pattern of the uppermost metal layer may be in a dummy pattern, or the uppermost metal layer may be empty.

In the nonvolatile memory, in the external pad bonding area PA, a lower metal pattern 273*a* having the same shape as that of an upper metal pattern 372*a* of the cell area CELL may be formed on the uppermost metal layer of the peripheral circuit area PERI in correspondence to the upper metal pattern 372*a* formed on the uppermost metal layer of the cell area CELL. The lower metal pattern 273*a* formed on the uppermost metal layer of the peripheral circuit area PERI may not be connected to a separate contact in the peripheral circuit area PERI. Similarly, in the external pad bonding area PA, an upper metal pattern 373*a* having the same shape as that of the lower metal pattern 273*a* of the peripheral circuit area PERI may be formed on the upper metal layer of the cell area CELL in correspondence to the lower metal pattern 273*a* formed on the uppermost metal layer of the peripheral circuit area PERI.

Lower bonding metals 271*b* and 272*b* may be formed on the second metal layer 240*b* of the word line bonding area WLBA. In the word line bonding area WLBA, the lower bonding metals 271*b* and 272*b* of the peripheral circuit area PERI may be electrically connected to the upper bonding metals 371*b* and 372*b* of the cell area CELL by the bonding method.

In addition, in the bit line bonding area BLBA, an upper metal pattern 392 having the same shape as that of the metal pattern 252 may be formed on the uppermost metal layer of the cell area CELL in correspondence to the lower metal pattern 252 formed on the uppermost metal layer of the peripheral circuit area PERI. A contact may not be formed on the upper metal pattern 392 formed on the uppermost metal layer of the cell area CELL.

While the inventive concept has been particularly shown and described with reference to embodiments thereof, it will be understood that various changes in form and details may be made therein without departing from the spirit and scope of the following claims.

What is claimed is:

1. An integrated circuit, comprising:

a first block including a first wrapper and a first area of circuit elements isolated by the first wrapper;

a target block, which includes a second wrapper and a second area of circuit elements isolated by the second wrapper, and a third wrapper and a third area of circuit elements isolated by the third wrapper; and a second block including a fourth wrapper and a fourth area of circuit elements isolated by the fourth wrapper;

wherein the second wrapper is connected in series with the first wrapper, and is configured to perform a test operation on the second area;

wherein the third wrapper is connected in series with the fourth wrapper, and is configured to perform a test operation on the third area;

wherein the first block is configured to receive a test signal, and the first wrapper included in the first block is configured to input the test signal to the second area of circuit elements included in the target block;

wherein the second wrapper is configured to receive the test signal after the test signal has been input to the second area of circuit elements by the first wrapper and has passed through the second area of circuit elements;

wherein the first area is an edge area of the first block positioned between the first wrapper and the second wrapper;

wherein the second area is an edge area of the target block positioned between the first wrapper and the second wrapper;

wherein the third area is another edge area of the target block positioned between the third wrapper and the fourth wrapper; and wherein the fourth area is an edge area of the second block positioned between the third wrapper and the fourth wrapper.

2. The integrated circuit of claim 1, wherein the first and second wrappers are configured to share a wrapping signal, which is received as an input from external the integrated circuit.

3. The integrated circuit of claim 1, wherein the third and fourth wrappers are configured to share a wrapping signal, which is received as an input from external the integrated circuit.

4. The integrated circuit of claim 1, wherein the first, second, third, and fourth wrappers are each configured to include a plurality of register circuits, and to share a wrapping signal.

5. The integrated circuit of claim 4, wherein each of the plurality of register circuits includes:

a first multiplexer configured to receive a data shift enable signal;

a second multiplexer configured to receive a data capture enable signal; and a first flip-flop configured to extract captured data; and wherein in each of the plurality of register circuits, the first multiplexer is directly connected to the second multiplexer, and the first flip-flop is connected to the second multiplexer.

6. The integrated circuit of claim 1, wherein the first, second, third, and fourth wrappers are configured to pass an input signal therethrough, when in an inactive state.

7. The integrated circuit of claim 1, wherein during a security mode of operation, the second wrapper and the third wrapper are each configured to receive a security signal and block an input signal.

8. The integrated circuit of claim 1, wherein the first wrapper is further configured to input the test signal to the first area of circuit elements included in the first block.

9. The integrated circuit of claim 1, wherein the second area of circuit elements is isolated by both the first wrapper and the second wrapper.

10. The integrated circuit of claim 1, wherein the first wrapper included in the first block is configured to input the test signal to the second area of circuit elements included in the target block via one or more output terminals of the first block; and wherein the target block is external to the first block.

11. The integrated circuit of claim 1, wherein the second wrapper is configured to receive the test signal after the test signal has been input to the second area of circuit elements by the first wrapper and has passed through the second area of circuit elements, without the second wrapper having input the test signal to the second area of circuit elements.

12. A memory device comprising an integrated circuit, the integrated circuit comprising:

a first block including a first wrapper and a first area of circuit elements isolated by the first wrapper;

a target block external to the first block, the target block including a second wrapper and a third wrapper; and a second block external to the target block, the second block including a fourth wrapper and a fourth area of circuit elements isolated by the fourth wrapper;

wherein the target block includes a second area of circuit elements isolated by the second wrapper, and a third area of circuit elements isolated by the third wrapper;

wherein the second wrapper is connected to the first wrapper and configured to perform a test operation on the second area;

wherein the third wrapper is connected to the fourth wrapper and configured to perform a test operation on the third area;

wherein the first block is configured to receive a test signal, and the first wrapper included in the first block is configured to input the test signal to the second area of circuit elements included in the target block;

wherein the second wrapper is configured to receive the test signal after the test signal has been input to the second area of circuit elements by the first wrapper and has passed through the second area of circuit elements, without the second wrapper having input the test signal to the second area of circuit elements;

wherein the first area is an edge area of the first block positioned between the first wrapper and the second wrapper;

wherein the second area is an edge area of the target block positioned between the first wrapper and the second wrapper;

wherein the third area is another edge area of the target block positioned between the third wrapper and the fourth wrapper; and wherein the fourth area is an edge area of the second block positioned between the third wrapper and the fourth wrapper.

13. The memory device of claim 12, wherein the first and second wrappers are configured to share a wrapping signal; and wherein the second wrapper is connected in series with the first wrapper.

14. The memory device of claim 12, wherein the third and fourth wrappers are configured to share a wrapping signal; and wherein the third wrapper is connected in series with the fourth wrapper.

15. The memory device of claim 12, wherein the first, second, third, and fourth wrappers are configured to include a plurality of register circuits, and to share a wrapping signal.

16. The memory device of claim 15, wherein each of the plurality of register circuits includes:

a first multiplexer configured to receive a data shift enable signal;

a second multiplexer configured to receive a data capture enable signal; and a first flip-flop configured to extract captured data.

17. The memory device of claim 12, wherein during a security mode, the first, second, third, and fourth wrappers are each configured to receive a security signal and block an input signal.

18. The memory device of claim 12, further comprising one or more top level logic circuits configured to drive circuitry to be tested.

19. A method of operating an integrated circuit to perform a test on a memory device, the method comprising:

inputting a test signal to a first wrapper of a first block;

forming a wrapper chain by using the first wrapper, a second wrapper of a target block, a third wrapper of the target block, and a fourth wrapper of a second block;

inputting, via the first wrapper of the first block, the test signal to an area of circuit elements included in the target block;

receiving, via the second wrapper of the target block, the test signal after the test signal has been input to the area of circuit elements by the first wrapper and has passed through the area of circuit elements, without the second wrapper having input the test signal to the area of circuit elements; and extracting, from the wrapper chain, an output value generated in response to the test signal;

wherein the area of circuit elements is an edge area of the target block adjacent to the second wrapper and positioned between the first wrapper and the second wrapper.

20. The method of claim 19, wherein the target block is external to the first block; and wherein the second block is external to the target block.

* * * * *